US011452198B2

(12) United States Patent
Louco

(10) Patent No.: US 11,452,198 B2

(45) Date of Patent: Sep. 20, 2022

(54) THERMALLY INSULATED PRINTED CIRCUIT BOARD

(71) Applicant: BorgWarner, Inc., Auburn Hills, MI (US)

(72) Inventor: Lathom Alexander Louco, Arden, NC (US)

(73) Assignee: BORGWARNER, INC., Auburn Hills, MI (US)

(*) Notice: Subject to any disclaimer, the term of this patent is extended or adjusted under 35 U.S.C. 154(b) by 386 days.

(21) Appl. No.: 16/522,170

(22) Filed: Jul. 25, 2019

(65) Prior Publication Data

US 2021/0029817 A1 Jan. 28, 2021

(51) Int. Cl.

*H05K 1/02* (2006.01)
*H05K 1/18* (2006.01)
*H05K 7/14* (2006.01)

(52) U.S. Cl.

CPC ........... *H05K 1/0203* (2013.01); *H05K 1/181* (2013.01); *H05K 7/1427* (2013.01); *H05K 2201/066* (2013.01); *H05K 2201/10507* (2013.01)

(58) Field of Classification Search

CPC combination set(s) only.
See application file for complete search history.

(56) References Cited

U.S. PATENT DOCUMENTS 4,547,834 A * 10/1985 Dumont ................ H01L 23/473 257/E23.098
4,888,988 A 12/1989 Lee et al.
5,343,358 A * 8/1994 Hilbrink ................ H05K 7/208 174/15.2
5,467,251 A 11/1995 Katchmar
5,669,775 A * 9/1997 Campbell .............. H05K 1/189 361/761
5,692,297 A 12/1997 Noda
5,777,846 A 7/1998 Hayes et al.
5,812,375 A * 9/1998 Casperson ............. H05K 7/205 361/720
6,154,367 A * 11/2000 Pavlovic ............ H05K 7/20509 361/720
6,211,520 B1 4/2001 Ishikawa et al.
6,270,835 B1 * 8/2001 Hunt ...................... H05K 1/162 427/256
7,023,699 B2 * 4/2006 Glovatsky .......... H05K 7/20454 361/708

(Continued)

FOREIGN PATENT DOCUMENTS

CN 102231936 A 11/2011
CN 105538827 A 5/2016

*Primary Examiner* — Krystal Robinson

(74) *Attorney, Agent, or Firm* — Reising Ethington P.C.

(57) ABSTRACT

A printed circuit board (PCB) including a first side and a second side; a conductive layer within the PCB between the first side and the second side; one or more first side electrical components that are physically attached to the first side and electrically connected to the conductive layer; one or more second side electrical components attached to the second side of the PCB and electrically connected to the conductive layer; and a thermally and electrically insulating dielectric layer, within the PCB between the first side electrical components and the second side electrical components, that prevents heat emitted by the first side electrical components from increasing the temperature of the second side electrical components.

5 Claims, 4 Drawing Sheets

(56) References Cited

U.S. PATENT DOCUMENTS 7,095,615 B2 * 8/2006 Nichols ................ H05K 7/1461 361/713
8,188,373 B2 5/2012 Hunrath
9,237,652 B2 * 1/2016 Yuen ....................... H01L 25/13
10,023,833 B2 7/2018 Akerstrom et al.
10,132,712 B1 11/2018 Zhang et al.
2004/0002235 A1 * 1/2004 Shi .......................... G06F 1/189 439/67
2004/0055152 A1 * 3/2004 Fraivillig ............. H05K 3/0097 174/250
2005/0122698 A1 * 6/2005 Ho ......................... H05K 1/185 361/764
2006/0139902 A1 * 6/2006 Happoya .............. H05K 1/0271 361/760
2006/0186536 A1 * 8/2006 Hsu ......................... H01L 24/24 257/E23.101
2006/0225914 A1 * 10/2006 Tan ........................ H05K 1/028 174/257
2008/0304237 A1 * 12/2008 Shiraishi ................ H05K 1/186 361/702
2009/0016911 A1 * 1/2009 Noelle .................... F02B 37/10 417/407
2010/0175375 A1 * 7/2010 Gilch ........................ F02C 9/20 251/129.01
2012/0126396 A1 * 5/2012 Zhao ....................... H01L 23/36 257/737
2013/0126082 A1 5/2013 Kim et al.
2016/0084173 A1 * 3/2016 Haughton ................. F01N 5/04 60/273

* cited by examiner 50
60a
68
70
62
66
56
58
64c
60b
64b
70
64a
54
52

THERMALLY INSULATED PRINTED CIRCUIT BOARD

TECHNICAL FIELD

The present application relates to printed circuit boards (PCBs) and, more particularly, to thermal insulation of a PCB.

BACKGROUND

Printed circuit boards (PCBs) can be used to implement a wide array of different electrical circuit configurations. A PCB can include one or more substrate layers that carry electrical components and one or more conductive layers having circuit traces that electrically link the electrical components. The identity and quantity of the electrical components, as well as the quantity of conductive layer(s), can be chosen based on the design of the circuit(s) included in the PCB. PCBs, by virtue of their efficient use of space, can carry a substantial quantity of electrical components that are coupled to the PCB. A PCB with an increased density of electrical components can include the components on both sides of the PCB. However, an increased density/quantity of electrical components can also increase the amount of heat generated by the PCB. And some electrical components are negatively affected by elevated levels of heat. With respect to some PCB implementations in which both sides of the PCB carry electrical components, it may be challenging to cool electrical components carried by the PCB.

SUMMARY

In one implementation, a printed circuit board (PCB) includes a first side and a second side; a conductive layer within the PCB between the first side and the second side; one or more first side electrical components that are physically attached to the first side and electrically connected to the conductive layer; one or more second side electrical components attached to the second side of the PCB and electrically connected to the conductive layer; and a thermally and electrically insulating dielectric layer, within the PCB between the first side electrical components and the second side electrical components, that prevents heat emitted by the first side electrical components from increasing the temperature of the second side electrical components.

In another implementation, a PCB includes a first side and a second side; a conductive layer within the PCB between the first side and the second side; one or more apertures in the first side for receiving one or more first side electrical components that are electrically connected to the conductive layer and positioned within the aperture(s) on the first side, wherein the top surface of the first side electrical component(s) is configured to contact a heat sink; one or more second side electrical components attached to the second side of the PCB; and a thermally and electrically insulating dielectric layer, within the PCB between the first side electrical components and the second side electrical components, that prevents heat emitted by the first side electrical components from increasing the temperature of the second side electrical components.

DETAILED DESCRIPTION

Printed circuit boards (PCBs) can use a thermally-insulating dielectric layer within a laminate stack to minimize the heat transfer from electrical components on one side of the PCB to electrical components mounted on an opposite side of the PCB. For example, with respect to a PCB that includes electrical components forming an electrical circuit regulating an electric motor that powers an electrically-actuated turbo charger, the PCB can include a gate driver on one side of the PCB and a power switch on the opposite side of the PCB at least somewhat vertically overlapping with the gate driver. An area of one side of the PCB physically occupied by an electrical component or "footprint" can overlap with an area of an opposite side of the PCB physically occupied by another electrical component such that the components at least partially overlap in the Z-axis direction. The switch can be embedded into the PCB so that it is flush or nearly flush with a side of the PCB that abuts a heat sink. Certain types of electrical components can be vulnerable to heat fluctuations that may degrade performance. Inclusion of a thermally insulating dielectric layer within the PCB that insulatively protects electrical components on one side of the PCB from heat generated by electrical components on the other side of the PCB can minimize the effect of heat generated on one side of the PCB from impinging on components mounted on the other side of the PCB. Electrical components that carry out sensing or measurement, such as microprocessors, may be especially sensitive to temperature changes, which can decrease the accuracy of those components.

In one implementation, electrical components regulating power supply (e.g., switches) and/or controlling electrical motors in motor drive applications can be mounted on one side of the PCB while integrated circuits (ICs), such as microprocessors, controlling and monitoring the power electrical components regulating power can be mounted on the other side of the PCB—a short electrically conductive distance from each other through the PCB when overlapping in the vertical direction. The close proximity of the electrical components regulating power supply on one side of the PCB and microcontrollers on an opposite side of the PCB separated by a short distance can increase electrical performance of the electrical circuit these components are included with but also increase the amount of heat conveyed from the switches to the ICs. To minimize heat conduction from the power regulating electrical components to the IC, the PCB can include a thermally-insulating dielectric layer positioned adjacent one or more conductive layers within the PCB.

Figure 1:
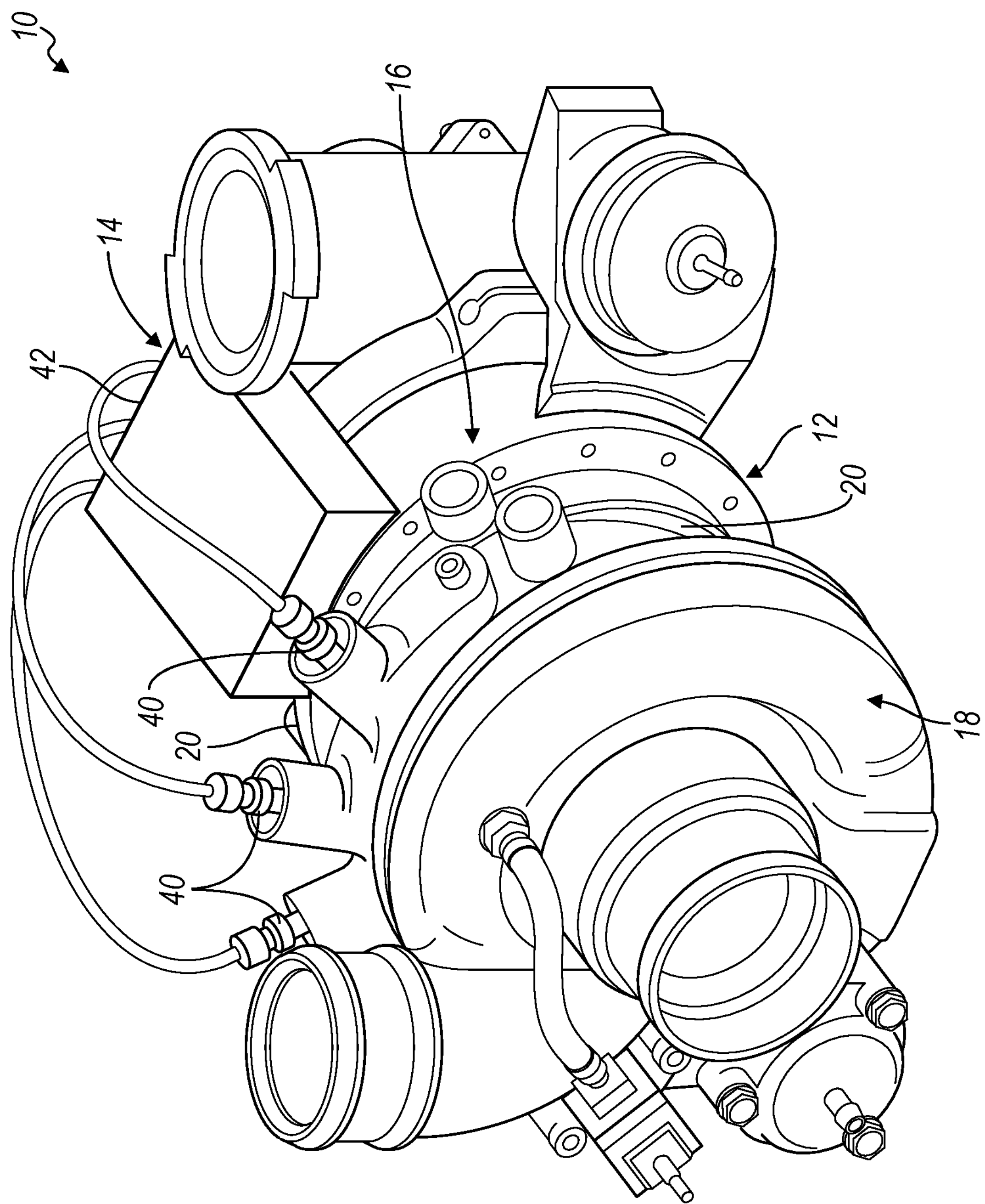
FIG. 1 is an isometric view depicting an implementation of an electrically-actuated turbocharger assembly.
Figure 2:
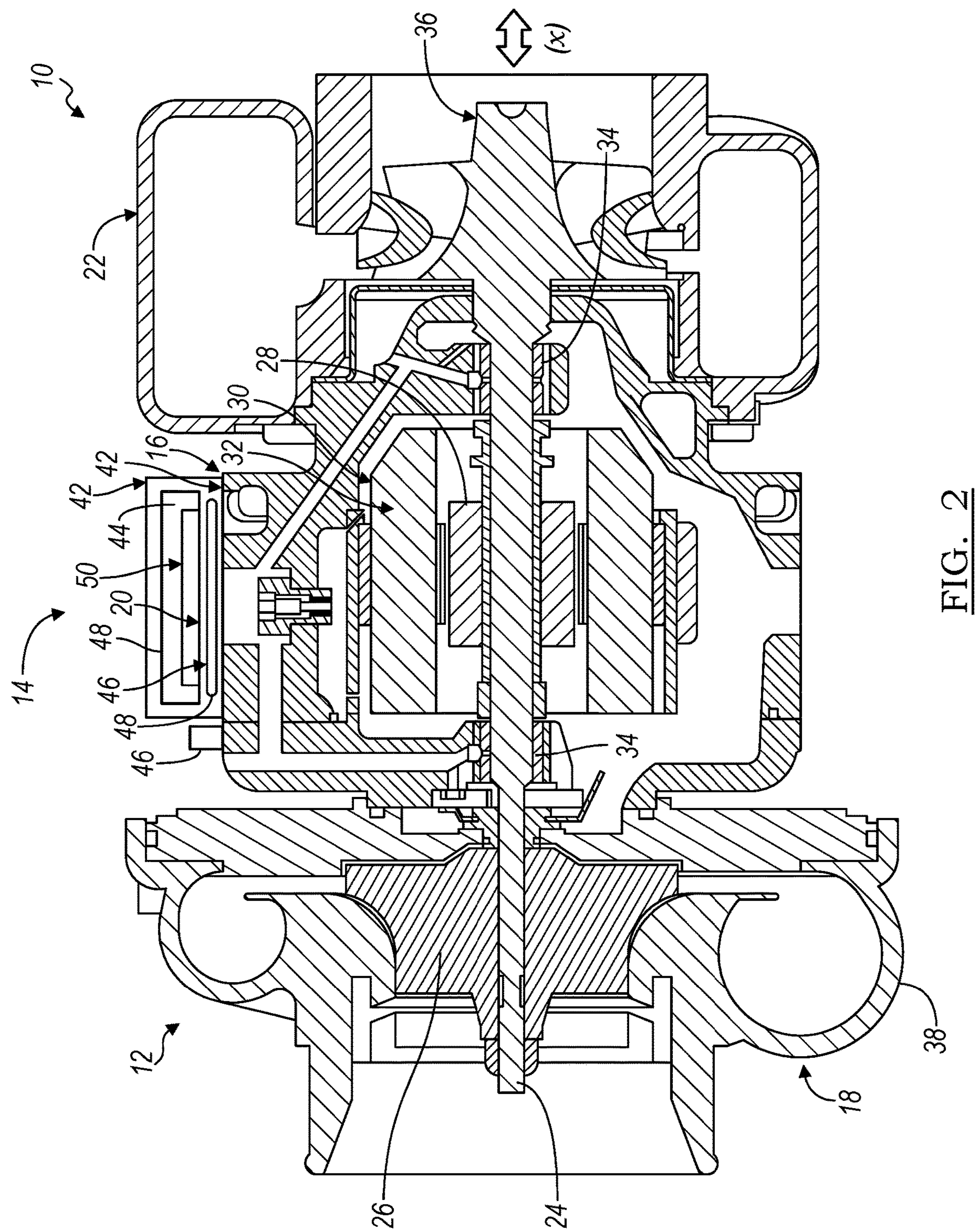
FIG. 2 is a cross-sectional view depicting an implementation of an electrically-actuated turbocharger.

FIGS. 1-2 depict an environment in which a PCB having a thermally-insulating dielectric layer can be used. The environment includes an implementation of an electrically-actuated turbocharger assembly 10 with an electrically-actuated turbocharger 12 and an electronics assembly 14 that includes an insulated PCB received by a housing. While this is one possible implementation of a thermally-insulated PCB, it should be understood that the PCB can be used in other environments and/or implementations and with a wide variety of electrical components. The electrically-actuated turbocharger 12 includes a compressor portion 18, an electric motor portion 20, and an exhaust portion 22 that are assembled to form a structure that receives the components of the turbocharger 12. A turbine shaft 24 extends through the compressor portion 18, the electric motor portion 20, and the exhaust portion 20 as can be appreciated in FIG. 2. At one end, the turbine shaft 24 couples with a compressor 26, located in the compressor portion 18, that spins to compress air, which is ultimately supplied to an intake plenum (not shown) of an internal combustion engine (ICE). Another portion of the turbine shaft 24 that is axially-spaced from the compressor 26 and located in the electric motor portion 20 couples with a rotor assembly 28 of an electric motor 30. The rotor assembly 28 can be positioned concentrically relative to a stator 32 included in the electric motor portion 20. One or more bearings 34 are included in the electric motor portion 20 and axially spaced along the turbine shaft 24 to support and stabilize the turbine shaft 24, the compressor 26, the rotor assembly 28, and an exhaust turbine 36 as these elements rotate within the turbocharger 12 during operation. The exhaust turbine 36 is coupled to an end of the turbine shaft 24 distal to the compressor 26 located in the exhaust portion 22.

The compressor portion 18 includes a compressor chamber 38 in which the compressor 26 spins in response to the rotation of the turbine shaft 24 and compresses air that is ultimately supplied to the intake manifold of the ICE. The compressor 26 is coupled with the turbine shaft 24 that extends from the compressor portion 18 into the electric motor portion 20 and the exhaust portion 22. The rotor assembly 28 is coupled to the turbine shaft 24 so that the rotor assembly 28 and the turbine shaft 24 are not angularly displaced relative to each other. When combined, the rotor assembly 28 extends axially relative to the shaft 24 in close proximity to the stator 32. The stator 32 can include a plurality of windings that convey electrical current from the power electronics and induce the angular displacement of the rotor assembly 28 and the turbine shaft 24 coupled to the rotor assembly 28 relative to the stator 32. In one implementation, the stator 32 and the rotor 28 can be implemented as a direct current (DC) brushless motor that receives DC voltage from a vehicle battery. The amount of DC voltage applied to the stator 32 may be greater than 40 volts (V), such as can be provided by a modern 48V vehicle electrical system. Other implementations are possible in which a vehicle electrical system uses higher voltages, such as 400V and 800V. Electrical connectors 40 are included on the electrically actuated turbocharger 12 and communicate electrical power from an electrical source to a PCB that regulates electrical current supplied to the electrical motor of the electrically-actuated turbocharger 12.

A PCB housing 42 is coupled with the assembly 10. The PCB housing 42 includes a cavity 44 for receiving a PCB 50 and a heat sink 46 that directly abuts the PCB 50. The heat sink 46 can be implemented in a variety of ways, such as a fluid passage 48 carrying engine oil or engine coolant that has been cooled by a radiator (not shown). The fluid can travel from the ICE (not shown) through the radiator where it is cooled and on to the fluid passage 48 in the PCB housing 42. The cooled fluid can help remove heat from the PCB 50 and electrical components carried by the PCB 50. It should be appreciated that in other embodiments the PCB housing 42 and heat sink 46 can be positioned separate and away from the turbocharger assembly 10. The PCB 50 and PCB housing 42 can be electrically connected to the electric motor via electric cabling.

The exhaust portion 22 is in fluid communication with exhaust gases generated by the ICE. As the revolutions per minute (RPMs) of the crankshaft of the ICE increase, the volume of the exhaust gas generated by the ICE increases and correspondingly increases the pressure of exhaust gas in the exhaust portion 22. This increase in pressure can also increase the angular velocity of the exhaust turbine 36 that communicates rotational motion to the compressor 26 through the turbine shaft 24. In this implementation, the compressor 26 receives rotational force from the exhaust turbine 36 and the electric motor 30. More particularly, when the ICE is operating at a lower RPM, the electric motor 30 can provide rotational force to the compressor 26 even though exhaust gas pressure within the exhaust portion 22 is relatively low. As the ICE increases the RPM of the crankshaft, exhaust gas pressure within the exhaust portion 22 can build and provide the rotational force that drives the compressor 26. The electronics assembly 14 can be coupled to the housing 16 of the electrically-actuated turbocharger 12 as is shown in FIGS. 1-2. The electronics assembly 14 includes the PCB housing 42 and electrical connectors 40. The PCB housing 42 is shaped so that it fits closely with or abuts the housing 16.

However, it should be appreciated that the concepts described herein can be applied to electrically actuated turbochargers that are configured in different ways. For example, the electrically actuated turbocharger can be implemented using a compressor portion and an electric motor portion while omitting the exhaust portion. In such an implementation, the turbocharger includes a compressor coupled to the electric motor via a turbine shaft without relying on an exhaust turbine to also be coupled to the turbine shaft. This implementation can sometimes be referred to as an electric supercharger because forced induction in this implementation relies solely on the rotational force provided by an electric motor rather than also using an exhaust turbine that is rotationally driven by exhaust gases. The compressor chamber 38 is in fluid communication with a compressor inlet that draws air from the surrounding atmosphere and supplies it to the compressor 26. As the PCB selectively provides current to the windings of the stator 32, the rotor 28 is induced to rotate and impart that rotation on the turbine shaft 24 and the compressor 26.

Figure 3:
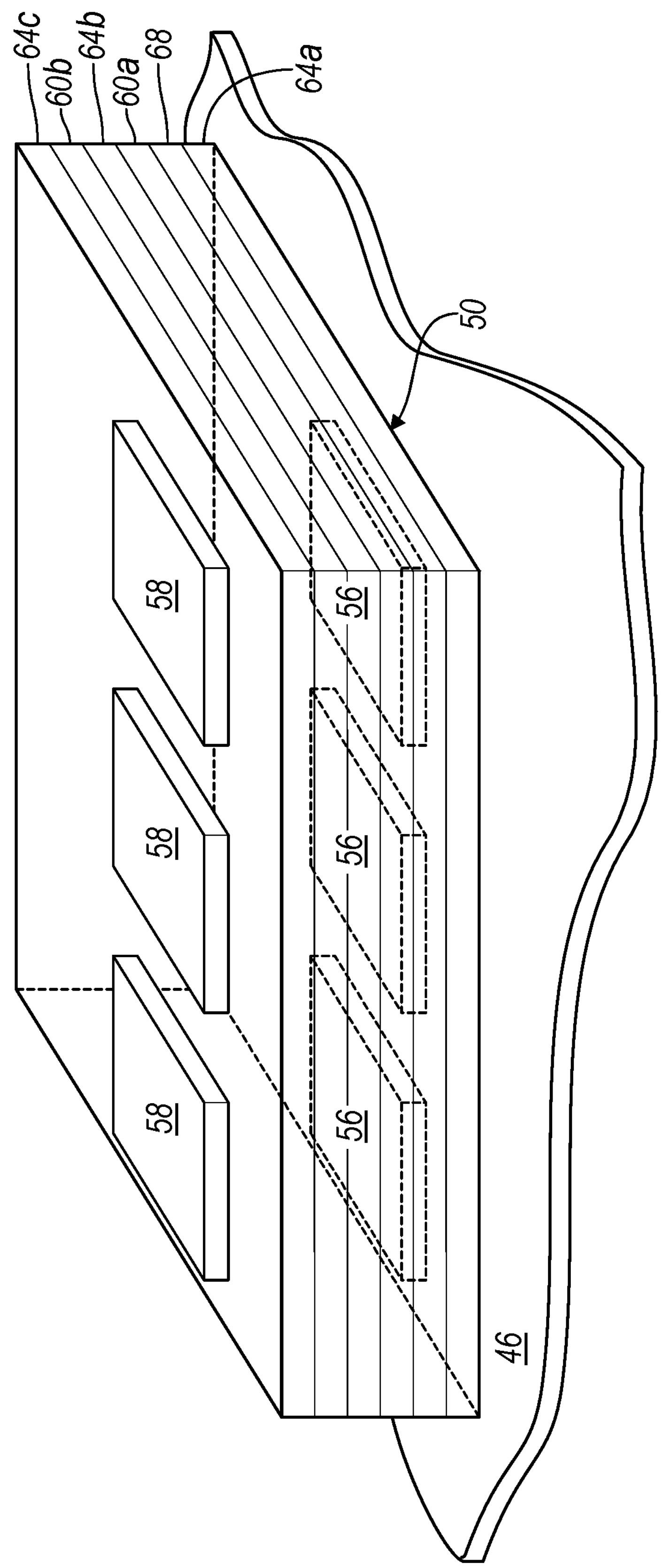
FIG. 3 is a perspective view depicting an implementation of a PCB.
Figure 4:
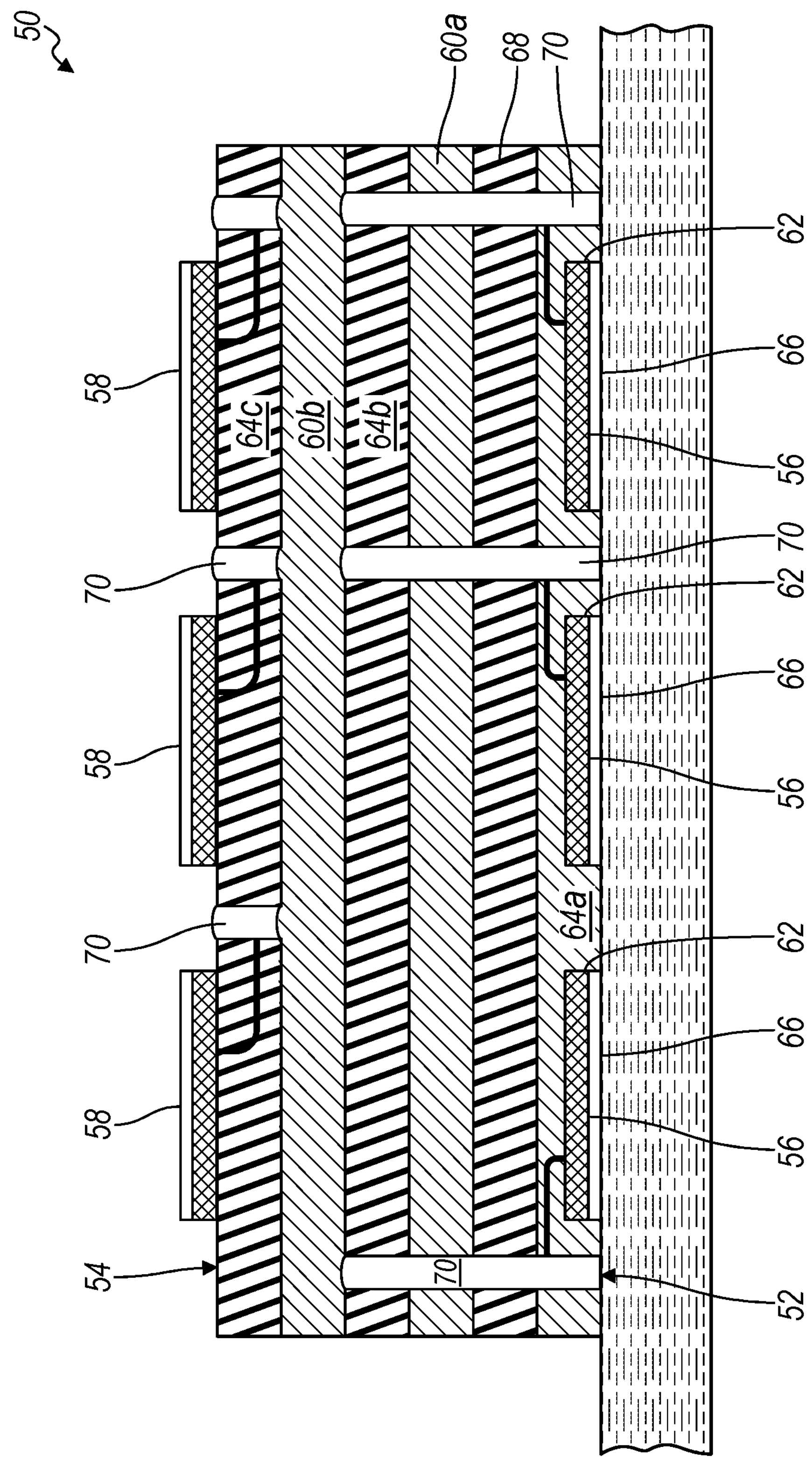
FIG. 4 is a cross-sectional view depicting an implementation of a PCB.

Turning to FIGS. 3-4, the thermally-insulated PCB 50 is shown in more detail. The PCB 50 comprises a first side 52 and a second side 54 opposite to the first side 52. One or more first side electrical components 56 are physically coupled to the first side 52 and electrically connected to one or more conductive layers 60 within the PCB 50. One or more second side electrical components 58 are physically coupled to the second side 54 and electrically connected to one or more conductive layers 60 within the PCB 50. The first side electrical components 56 can include heat-generating electrical components. For example, the first side electrical components 56 can include power-regulating switches, resistors, and capacitors to name a few. The first side electrical components 56 can be implemented as three power switches that are shown attached to the first side 52 of the PCB 50. The power switches can regulate the supply of electrical current to the electric motor 30 of the electrically-actuated turbocharger 12 and can be controlled by a gate driver implemented using a second side electrical component 58. The power switches can be transistors implemented as switches each having a source, a gate, and a drain. The transistor can be a Metal Oxide Field Effect Transistor (MOSFET), a Bipolar Junction Transistor (BJT), or other similar transistor as is known in the art. The transistor can be leaded such that a plurality of leads extend outward and away from the body of the transistor. Or in another implementation the transistor can be leadless such that the electrical leads are implemented as electrically-conductive pads positioned so that they are accessible from an outer surface of the transistor. Each type of transistor can be soldered to copper pads electrically communicating with one or more conductive layers 60 of the PCB 50. The PCB 50 can include different quantities of power switches depending on electric motor design.

The first side electrical components 56 and/or the first side 52 of the PCB 50 can abut the heat sink 46. The first side electrical components 56 can be coupled to the first side 52 through apertures 62 in a substrate layer 64 so that the first side electrical components 56 directly abut the heat sink 46. In such an implementation, a top surface 66 of the first side electrical components 56 can be flush or nearly flush with the first side 52 of the PCB 50. The heat sink 46 can include a substantially planar surface that directly abuts the first side 52 of the PCB 50 and the first side electrical components 56. The first side electrical components 56 can be located on the first side of the PCB 50 such that they are recessed into the PCB 50 and the top surface 66 of the components 56 may be flush with the first side 52. To receive the first side electrical components 56, cavities defined by the apertures 62 can be created by removing at least a portion of a first substrate layer 64*a* from a defined area that closely conforms to the outer walls of the first side electrical component 56. The first substrate layer 64*a* can be a glass-reinforced epoxy substrate that is commonly referred to as FR4. However, other substrate materials, such as another polymer, could be used instead. The first side electrical components 56 can have a height or thickness measured in the Z-direction of approximately 20 millimeters (mm) while a solder mask (not shown) can be approximately 1 mm thick, the conductive layers 60 may be approximately 3 mil thick (0.003 inches), and the substrate layers 64 can be approximately 50 micrometers (μm) thick.

The heat sink 46 can by positioned so that it is separated from the first side 56 of the PCB 50 as well as the top surface 66 of the first side electrical components 56 by only a thin dielectric layer, such as dielectric grease. Cooling fluid can circulate through the fluid passage 48 of the heat sink 42 to reduce the temperature of the first side electrical components 56 and carry heat away from the PCB 50. This is described in more detail by U.S. application Ser. No. 16/381,476, the entire contents of which are hereby incorporated by reference.

A thermally and electrically-insulating dielectric layer 68 ("dielectric layer") is positioned within the PCB 50 between the first side electrical components 56 and the second side electrical components 58. In this implementation, the PCB 50 stack, from bottom to top, includes the first substrate layer 64*a* physically connected to the first side electrical components 56, the first conductive layer 60*a* electrically connected to the first side electrical components 56, the dielectric layer 68 that may be bonded to the first conductive layer 60*a*, a second conductive layer 60*b* that may be bonded to the dielectric layer 68, opposite the first conductive layer 60*a*, and a second substrate layer 64*b*. It should be understood that PCBs having a dielectric layer used with different quantities of conductive/substrate layers is possible. The conductive layers 60 can be implemented using thin layers of bonded copper that include circuit traces cut out to implement one or more circuit traces on each conductive layer 60. The dielectric layer 68 can be implemented using a thin layer of polymide. The thermally-insulating dielectric layer 68 can have a thickness of 20-250 μm. The relatively small thickness of the thermally-insulating dielectric layer 68 can be beneficial to the performance of the electrical circuit carried by the PCB. For example, the dielectric layer 68 can be thin enough so that parasitic inductance caused by the layer 68 is minimized in comparison to other dielectrics, such as FR4. The material has high thermally- and electrically-insulative properties despite its relatively minimal thickness. The dielectric layer 68 can be applied as a thin sheet so that it adheres to the conductive layers 60. The first side electrical components 56 can be positioned in between the heat sink 46 and the dielectric layer 68 relative to the Z-axis. The dielectric layer 68 can prevent heat from passing through the PCB 50 and reaching the second side electrical components 58 while the heat sink 46 can help remove heat from the first side electrical components 56.

The second side electrical components 58 can include heat-sensitive computer or electrical devices the performance of which can be affected by elevated levels of heat. That is, output or signals from the heat-sensitive devices can change depending on the temperature at which they operate. The output or signal can "drift" as the heat at which the second side electrical components 58 operate increases. Second side electrical components 58 can include microprocessors/microcontrollers, such as an electronic control unit (ECU), or any type of device capable of processing electronic instructions including host processors, controllers, vehicle communication processors, and application specific integrated circuits (ASICs). The microcontroller or microprocessor can execute various types of digitally-stored instructions, such as software or firmware programs stored in a computer-readable memory device. The second side electrical components 58 can be electrically connected to the second conductive layer 60*b*. A third substrate layer 64*c* can be bonded to the second conductive layer 60*b* and the second side electrical components 58 can be physically attached to the third substrate layer 64*c*. A plurality of vias 70 extending through the dielectric layer 68 and second substrate layer 64*b* can electrically connect electrical circuits from the first conductive layer 60*a* to electrical circuits included in the second conductive layer 60*b* such that first side electrical components 56 are electrically connected to the second side electrical components 58. Vias 70 can extend in the Z-direction and electrically communicate or carry electrical power between two or more electrical components spaced apart in the Z-direction. The vias 70 can be blind vias, buried vias, filled vias, or through-hole vias as are known in the art.

The second side electrical components 58 can be electrically connected to the first side electrical components 56 so that the second side electrical components 58 control and monitor the first side electrical components 56. For example, microprocessor(s) on the second side 54 can open and close power switches on the first side 52 regulating the delivery of power to the electric motor 30. And the microprocessors can also receive a feedback signal that can be used as part of a control loop to regulate the electrical motor 30. The dielectric layer 68, positioned in between the second side electrical components 58 and the first side electrical components 56, can reduce or minimize the heat transfer from the first side electrical components 56 to the second side electrical components 58 through the PCB 50.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms “e.g.,” “for example,” “for instance,” “such as,” and “like,” and the verbs “comprising,” “having,” “including,” and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A printed circuit board (PCB) comprising:
- a first side and a second side;
- a conductive layer within the PCB between the first side and the second side;
- one or more first side electrical components that are physically attached to the first side and electrically connected to the conductive layer;
- one or more second side electrical components attached to the second side of the PCB and electrically connected to the conductive layer; and
- a thermally and electrically insulating dielectric layer, within the PCB between the first side electrical components and the second side electrical components, that prevents heat emitted by the first side electrical components from increasing the temperature of the second side electrical components, wherein at least one of the first side electrical components vertically overlaps at least one of the second side electrical components.

2. The PCB recited in claim 1, wherein a top surface of the first side electrical component(s) is coplanar with the first side of the PCB.

3. The PCB recited in claim 2, further comprising a heat sink that directly abuts the first side and the top surface of the first side electrical components.

4. The PCB recited in claim 1, further comprising, an electrically-actuated turbocharger that receives the PCB within a PCB housing.

5. The PCB recited in claim 4, wherein the electrically-actuated turbocharger comprises a compressor and an exhaust turbine.

* * * * *